SHIELDED SUPERCONDUCTOR CIRCUITS

Filed April 29, 1959 3 Sheets-Sheet 1

INVENTOR
JOHN J. LENTZ

BY John E. Dougherty Jr.
ATTORNEY

SHIELDED SUPERCONDUCTOR CIRCUITS

Filed April 29, 1959 3 Sheets-Sheet 2

Dec. 27, 1960 J. J. LENTZ 2,966,647

SHIELDED SUPERCONDUCTOR CIRCUITS

Filed April 29, 1959 3 Sheets-Sheet 3

United States Patent Office 2,966,647

Patented Dec. 27, 1960

2,966,647

SHIELDED SUPERCONDUCTOR CIRCUITS

John J. Lentz, Chappaqua, N.Y., assignor to International Business Machines Corporation, New York, N.Y., a corporation of New York Filed Apr. 29, 1959, Ser. No. 809,815

20 Claims. (Cl. 338—32)

The present invention relates to superconductor circuits and, more particularly, to superconductor circuits including one or more conductors, each of which is arranged adjacent one or more shields of superconductor material.

Superconductor circuits, of the type with which the subject invention is primarily concerned, usually include a number of superconductor current paths connected in parallel with respect to a current source. Superconductor gating devices are provided to selectively switch the current between these parallel paths. The rate at which this switching is accomplished and, therefore, the speed of operation of a circuit of this type are dependent, to a large degree, upon the inductance of the circuit and the resistance which can be selectively introduced into the circuit by the gating devices. Further, in order to enable such circuits to be arranged with one controlling another, it is necessary that the gating devices exhibit a gain greater than unity. It is therefore, desirable that such circuits be fabricated to exhibit low inductance; that the gating device employed be capable of introducing a relatively high resistance into the circuits; that the gating devices exhibit a gain greater than unity; and that the circuits and the gating devices having these desired characteristics be capable of being fabricated on a mass scale at a relatively low cost.

Copending application, Serial No. 625,512, filed November 30, 1956, in behalf of R. L. Garwin and assigned to the assignee of the subject application, shows a thin film gating device which meets all of the above requirements. The device of this copending application employs thin films of superconductor material which are laid down on a planar substrate to form a superconductor gating device. A film of a hard superconductor material is also laid down on the substrate with this film serving as a shield which both lowers the inductance of the device formed by the superconductor films and, at the same time, improves the Silsbee current characteristics of the films. Further, the thin film gate exhibits a relatively high resistance and, since the circuit may be fabricated on a planar substrate using vacuum evaporation or similar techniques of the type heretofore employed in the printed circuit art, the circuit including the gating device may be produced on a mass scale at a relatively low cost.

However, one difficulty which arises in fabricating circuits using the techniques of the above-cited copending application follows from the manner in which the shielding superconductor layers act to perform their functions. When currents are applied to the thin film conductors forming the circuit which is arranged adjacent the shielding layer, induced currents are produced in the shielding layer which prevent magnetic fields produced by the current in the circuit from penetrating the shielding layer. These induced currents flow in closed current paths in the shield. Thus, it becomes apparent that, for each conductor on the shield which carries current, a circulating current is induced in the shield. These circulating currents can have deleterious effects on circuit operation, especially where a large number of conductors are arranged on the same shield and currents are caused to flow in many of these conductors at the same time, since, in such a case, there is the possibility that circulating currents may merge to produce a current of extremely high density on the shield and, further, there is also the distinct possibility that the circulating currents will produce coupling between the various conductors on the shield. These circulating currents present a real problem to the circuit designer since it is very difficult to predict with certainty the exact location of all such currents for every possible condition of circuit operation.

In accordance with the principles of the present invention, all of the above mentioned advantages attendant the use of superconductor shields are realized while, at the same time, minimizing the possibility of deleterious effects being produced by circulating currents in the shield. As is illustrated in the embodiments of the invention described herein by way of illustration, improved superconductor circuits are provided by arranging the circuits, which may include one or more superconductor conductors, on a shield of superconductor material and connecting the conductors on the shield to the shield. With this type of arrangement, the shield itself provides a return path for currents applied to the conductors forming the circuit on the shield, and substantially all the current flowing in the shield images the current in the conductors on top of the shield. This return current flowing in the shield obviates the necessity of producing induced currents in the shield to prevent the penetration of magnetic flux through the shield. In circuits constructed in accordance with these principles, each conductor is provided with a connection from one of its ends to the shield and from the other of its ends to one terminal of a source which provides it with current. The circuit is completed by a connection from the shield to the other terminal of the current source which connection is made at a point adjacent the conductor on the shield. Circuits are also constructed in accordance with the principles of the subject invention, wherein two shields are provided, one above and one below the superconductor circuits, with connections being made from the circuit to each of these shields so that return current paths are provided both above and below the conductors forming the superconductor circuits.

Therefore, it is an object of the present invention to provide improved superconductor circuits.

Another object is to provide superconductor circuits employing one or more superconductor shields wherein the actual current distribution in the shield(s) can be predicted with greater certainty than has been heretofore possible.

A further object is to provide improved superconductor gating devices.

Still another object is to provide superconductor circuits employing one or more superconductor shields wherein the shields are connected to the circuits and provide return paths for the current in the circuits.

Still another object is to provide improved superconductor circuits arranged on a superconductor shield with connections between the shield and the circuits and from current supply means for the circuit to both the shield and the circuit, so that current applied to the conductors forming the circuit, regardless of the path in the circuit through which it is directed, returns in the shield in a path which essentially images the path in which the current is flowing in the circuit.

These and other objects of the invention will be pointed out in the following description and claims and illustrated in the accompanying drawings, which disclose, by way of examples, the principle of the invention and the best mode, which has been contemplated, of applying that principle.

Figures 1, 2:
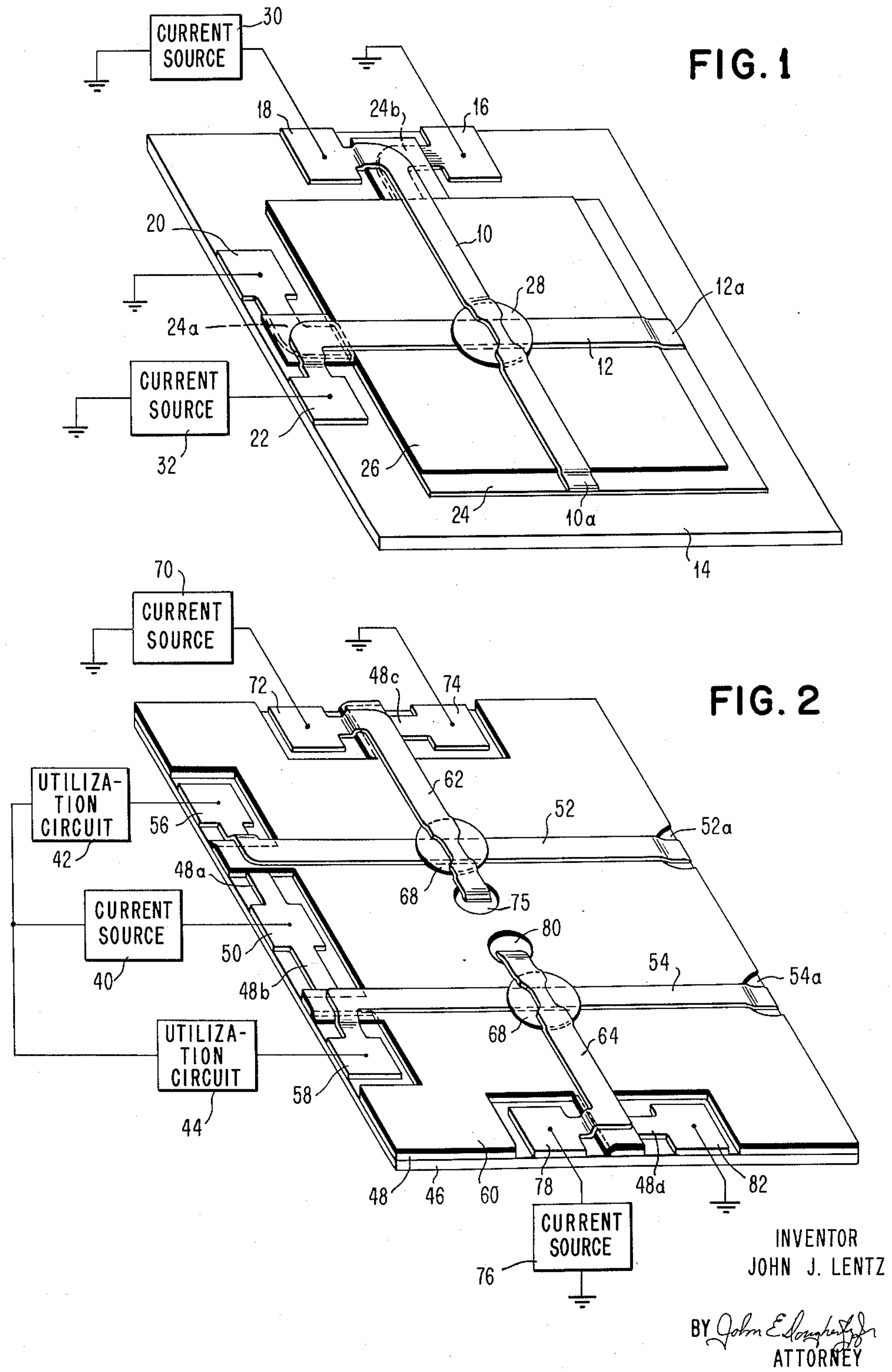
Fig. 1 shows an embodiment of a thin film cryotron constructed in accordance with the principles of the subject invention with both the gate and control conductor connected to a shield of superconductor material.
Figs. 2 and 3 show further embodiments of superconductor circuits mounted on superconductor shields with connections being provided from the circuits to the shields.

Referring now to the details of the drawings, Fig. 1 shows a thin film cryotron, of the general type shown and described in copending application, Serial No. 625,512, filed November 30, 1956, in behalf of R. L. Garwin and assigned to the assignee of the subject invention. The device of Fig. 1 has, however, been modified, in accordance with the principles of the subject invention, to provide connections between the superconductor shield on which the circuit is mounted and the various conductors forming the circuit. The cryotron shown includes a control conductor 10 and a gate conductor 12, arranged one above the other with the control conductor crossing the gate conductor. In the preferred embodiment shown, at least the portion of the gate conductor, which is traversed by the control conductor, is fabricated of a "soft" superconductor material and the remainder of the gate conductor is fabricated of a "hard" superconductor material. The terms "hard" and "soft" are relative, the former term denoting a material which requires a magnetic field of relatively high intensity to drive it resistive at the operating temperature of the circuit, and the latter denoting a material requiring a magnetic field of much lower intensity to drive it resistive at this temperature. In the illustrative embodiment shown, the soft superconductor material is tin and the hard superconductor material is lead with the operating temperature of the circuit being below the transition temperature for the tin gate. In the cryotron of the preferred embodiment of Fig. 1, as well as in those of the embodiments of the other figures, which are disclosed by way of illustration and not limitation, the cryotron control conductor is made narrower than its gate conductor at the point at which it traverses the gate conductor and the axes of these conductors are at right angles at the point of crossing, since this is one way of fabricating thin film cryotrons which exhibit gain.

The device is fabricated by successively evaporating, on a substrate 14, under a high vacuum, layers of insulating and hard and soft superconductor material. Substrate 14 is initially provided with lands 16, 18, 20 and 22 to which terminal connections to external circuits are made. The first step in the evaporation process is to evaporate a hard superconductor shield 24 on substrate 16. This shield is essentially rectangular but is provided with a segment 24*a*, which extends from the left edge of the shield to land 20, and a similar segment 24*b*, which extends from the upper edge of the shield to land 16. The next step is to evaporate a layer of insulating material 26, which covers all of the surface of the shield 24 with the exception of a narrow strip extending along its lower and right hand edges. Thereafter, the gate 12 is evaporated to extend from land 22 to the right edge of the shield wherein it makes contact with the shield at 12*a*. As pointed out above, all of the gate, with the exception of the portion beneath control conductor 10, is fabricated of a hard superconductor material, and the portion immediately beneath control conductor 10 is fabricated of a soft superconductor material. After the gate has been laid down, a layer of insulating material 28 is evaporated on top of that portion of the gate which is to be traversed by control conductor 10. Then the control conductor 10 is evaporated to extend from land 18 to a point 10*a* where it contacts shield 24. Land 18 is connected to current source 30 which supplies current to control conductor 10 and the return path for this current extends through the shield to land 16 and thence to ground in a manner which will be explained in detail below. Similarly, gate 12 is connected through land 22 to a current source 32 and the other terminal for this circuit is provided by the ground connection to land 20.

A superconductor shield such as 24, as is pointed out in the above-cited copending application, Serial No. 625,512, serves to reduce the inductance of the conductors forming the circuit mounted on the shield. The shield also serves to make more uniform the current distribution in these conductors, and particularly, in the soft superconductor gate. By making the current distribution in the gate more uniform, the shield actually raises the Silsbee current for the gate. In the absence of a connection between the conductors and the shield on which they are mounted, these advantages are realized as a result of the induced shield currents which produce magnetic fields in a direction to oppose magnetic fields produced by currents in the conductors. These currents, which are induced in the shield, must necessarily flow in a closed path and it is believed that usually such currents, after flowing immediately beneath the current carrying conductor, return along the edge of the shield. When a large number of conductors are laid down on a single shield and current is applied to a group of these conductors at the same time, there are a number of such circulating currents induced in the shield, the exact locations of which are not always known. As a result, at certain places in the shield and especially along its edges, the current density may reach a magnitude sufficient to have deleterious effects on the operation of the circuit, and further, these circulating currents can cause coupling between the conductors on the shield.

In the structure of Fig. 1, the conductors themselves are actually connected to the shield so that the shield provides a return current path for the current carried by the conductors. Thus, for example, when a current is applied to control conductor 10 of this circuit by current source 30, the current flows from land 18 through the conductor 10 on top of the shield to the junction 10*a* at which this conductor is connected to the shield. The current then returns in the shield along a path immediately below conductor 10 to and through the segment 24*a* of the shield to land 16, which is connected to ground. Though it might appear that the current supplied by source 30 could take any one of a number of paths from point 10*a* to land 16, or even possibly to another land such as 20 which is connected to the shield, the current in all cases returns in the path immediately below the conductor 10. The current necessarily returns in this path since it is the lowest inductance path available to it. Further, by flowing in this path, the return current produces a field opposing the field produced by the current in the conductor itself, thereby satisfying the requirement that no flux penetrate the superconductive shield, or differently stated, that there be no net change in flux linking any closed loop formed by the shield. In the case of a conductor mounted on a shield but not connected to the shield, it is the magnetic field produced by current in the conductor which, in attempting to penetrate the shield, induces a current in the shield. This induced current provides a magnetic field to oppose the applied field of the conductor. In the structure of Fig. 1, the same function is achieved by returning the current from the conductor through the shield in a path immediately below the conductor, and at the same time, no circulating currents are established in other parts of the shield. In a similar manner, the current path for current applied by source 32 extends from land 22 along gate conductor 12 to junction 12*a* at which point this current enters the shield and returns in a path immediately below conductor 12 to and through segment 24*a* to land 20, which is connected to ground. Particular note should be made of the fact that these distinct return paths for conductors 10 and 12 are provided in shield 24 by the arrangement shown, even though these conductors cross each other.

Though in the circuit of Fig. 1 only a single control and a single gate conductor are shown in the interests of providing a simple illustration of the principles of the invention, it should be understood that the cryotron of the circuit of Fig. 1 may be one of a number of cryotrons mounted on a single shield. An example of a simple cryotron circuit wherein the connections for a number of control and gate conductors are shown in detail is illustrated in the embodiment of Fig. 2. The function of the circuit of Fig. 2 is to direct current supplied by a current source 40 to one or the other of a pair of utilization output circuits 42 or 44. The circuit is similar to the circuit of Fig. 1 in that it includes a number of superconductor strips evaporated on a substrate 46 with the strips being suitably insulated one from the other and each connected to a shield 48 which is evaporated on top of the substrate. Utilization circuits 42 and 44, which may be laid down on another substrate, extend in parallel from one terminal of source 40 to lands 56 and 58, respectively. A conductor 52 extends from land 56 across the width of the substrate to a point 52*a* at which it is connected to a shield 48. A return path for this conductor extends immediately beneath it in shield 48 to a segment 48*a* of the shield. This segment is connected to the terminal at land 50, which is connected to the other terminal of source 40. Similarly, another conductor 54 extends from land 58 across the width of the substrate to a junction 54*a* with shield 48, and thence back through the shield to and through a segment 48*b* to a land 50. A layer of insulating material 60 serves to insulate the conductors 52 and 54 from shield 48 except at points 52*a* and 54*a*. Path 52 is traversed by a control conductor in the form of a superconductor strip 62 and, similarly, path 54 is traversed by a control conductor in the form of superconductor strip 64. The control conductors are insulated from the paths by insulating layers 68 and the gate portion of each of the paths 52 and 54, which is traversed by the associated control conductors, is fabricated of a soft superconductor material so that it may be selectively controlled between superconductive and resistive states by current signals applied to the control conductor.

Control signals are applied to control conductor 62 by a current source 70 connected to land 72. Control conductor 62 extends from this land to an opening 75 in insulating layer 60, at which point this conductor makes contact with shield 48, so that any current applied to the conductors is returned in shield 48 to segment 48*c* of the shield. Segment 48*c* is connected to land 74 which, in turn, is connected to the other terminal of source 30, here shown as ground. In a similar manner, current signals are applied to control conductor 64 by a signal source 76, which has one terminal connected to a land 78 and a ground terminal connected to a land 82. This control conductor extends to an opening 80 in insulating layer 60 at which point it contacts shield 48. The return path for control conductor 64 extends immediately beneath it in shield 48 to and through a segment 48*d* of this shield to a land 82, which is connected to ground. When in operation, the current is directed from current source 40 to one or the other of the output utilization circuits 42 or 44 by selectively energizing current sources 70 and 76. Thus, for example, when current source 76 is energized, the gate portion of conductor 54 is driven resistive so that the entire current from source 40 is directed through utilization circuit 42 to land 56 and thence through conductor 52 to junction 52*a*. The current flows from this junction back through a path in shield 48 immediately beneath conductor 52 to and through segment 48*a* to land 50 and the other terminal of current source 40. It should be noted that, even though individual junctions are provided at points 52*a* and 54*a* between the conductors 52 and 54 and shield 48, when a current is caused to flow in either one of these two conductors, the current will return in the shield via a path immediately beneath that conductor to the proper one of the lands 56 or 58. Similarly, when a current signal is applied to either one of the control conductors 62 or 64, the current is directed to the shield at the appropriate opening 75 or 80 in insulating layer 60, and thence back immediately beneath the control conductor to which the current is applied to the proper one of the ground terminal lands 74 or 82.

The output circuit represented by blocks 42 and 44 are completely superconductive so that, once the current is directed to either one of the paths 52 or 54, the current remains in that path until the associated control conductor is energized. Thus, when as above described, control conductor 64 is energized to cause the current from source 40 to be directed through path 52 and, thus, to utilization circuit 42, the circuit remains stably in this state with the entire current in this conductor even after control conductor 64 is deenergized. The circuit may be switched to its other stable state, with the entire current being directed through path 54 to utilization circuit 44, by energizing control conductor 62 with a signal supplied by current source 70.

Figure 3:
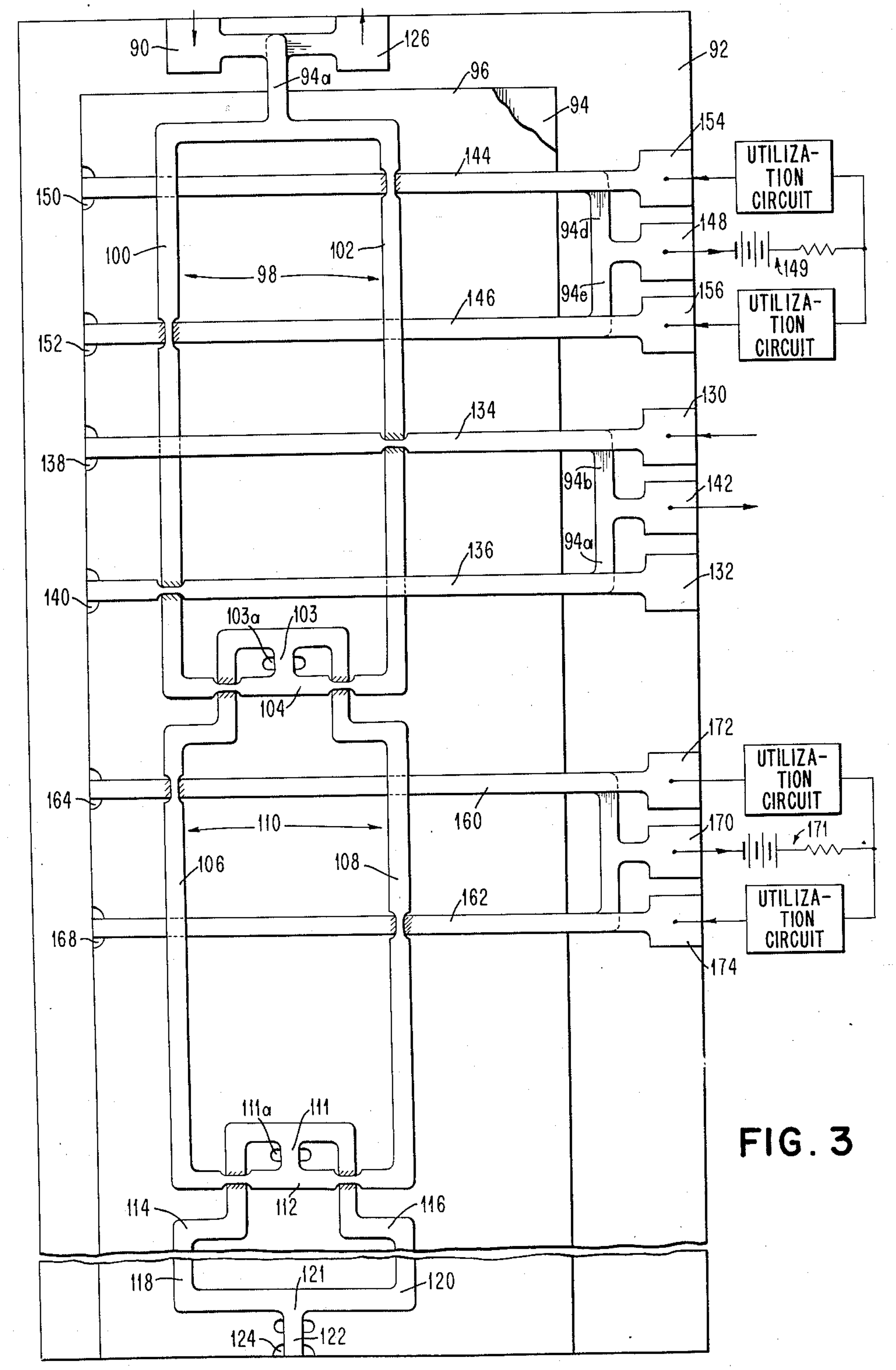

The embodiment of Fig. 3 shows a superconductor circuit including a number of conductors connected both in series and parallel with each of the current paths formed by the conductors being terminated in the shield at the end of the path, so that a return path is provided in the shield itself for current supplied to any of the conductors on the shield. This circuit includes a number of bistable superconductor circuits which are connected in series with a current source (not shown) connected to a land 90 located at the upper edge of a substrate 92 on which the circuit is mounted. As in the other embodiments, a shield, here designated 94, is evaporated on substrate 92 and this shield is provided with segments which extend to lands arranged along the sides of the substrate at which terminal connections to external circuits are made. A layer of insulating material 96 is evaporated on shield 94 with openings provided in the insulating material at points at which the conductors forming the various circuits, which are thereafter evaporated, are to make contact with the shield. Openings in the shield are also provided below the locations at which conductors connecting the successive bistable circuits are later to be evaporated. The first of the bistable circuits connected to land 90 is generally designated 98 and includes a pair of parallel conductors 100 and 102. These conductors are brought together at junction 104, from which extend another pair of parallel conductors 106 and 108 which form a second bistable circuit generally designated 110. In a similar manner, conductors 106 and 108 are brought together at junction 112 from which extend a pair of parallel conductors 114 and 116 which form a third bistable circuit. As is indicated by the broken lines on the drawings, any number of parallel circuits may be connected in series with the current source. The last of these parallel circuits is formed of a pair of conductors, here designated 118 and 120, which are brought together at a junction 121, from which a conductor 122 extends to an opening 124 in the layer of insulating material 96. Conductor 122 makes contact with shield 94 at this point. Openings designated 103*a*, 111*a* and 122*a* are provided in the shield 94 beneath conductors 103, 111 and 122 which connect the successive bistable circuits to each other and to the shield at 124. The inductance of the unshielded portion of each of these conductors is relatively high. In this way, inductive chokes are provided between the bistable circuits which prevent a current change in one of the bistable circuits from either affecting or being affected by the other bistable circuits except through the agency of the control conductors that are provided specifically for this purpose.

When the circuit of Fig. 3 is in operation, the supply current applied to land 90 is directed to one or the other of the parallel paths of each of the series connected bistable circuits and, after leaving junction 121, is directed to the shield by conductor 122. The current flows in the shield from this junction in a path exactly imaging the path in which the current flows in the conductors forming the bistable circuits on top of the shield, with the exception that the current flows beneath conductors 103, 111 and 122 around the openings in shield 94. Shield 94 is provided with a segment 94*a*, which is connected to a land 126 which, in turn, is connected either directly or through further superconductor circuitry to the ground terminal for the supply current. Each of the bistable circuits is provided with control conductors which are arranged adjacent gates in the next bistable circuit in the series, so that each bistable circuit controls the next of the bistable circuits on the shield. In the diagram of Fig. 3, the portions of the superconductor strips, which are fabricated of soft superconductor material and, therefore, serve as gate conductors, are shaded, and the control sections of the superconductor strips are narrower than the other sections of these strips. Thus, it can be seen that path 102 of bistable circuit 98 includes a control conductor which controls the gate connected in path 108 of bistable circuit 110, and similarly, path 100 of bistable circuit 98 includes a control conductor for a gate connected in path 106 of bistable circuit 110. With this type of connection, when the current applied to land 90 is directed into path 100 of bistable circuit 98, this current is effective to introduce resistance into path 106 of bistable circuit 110 and the supply current is, therefore, directed into the other path 108 of this bistable circuit. It should be noted that, for the ease of illustration, each bistable circuit is shown to be controlling only the next one of the bistable circuits in the series circuit. Circuitry may be designed in accordance with the principles of the invention wherein each bistable circuit may control one or more bistable circuits which may be connected at any point in the series of such circuits. For example, circuits of the type shown in copending application, Serial No. 783,480, filed December 29, 1958, in behalf of D. J. Dumin, may be fabricated in accordance with the principles of the subject invention. Such circuits, as described in detail in this application, include a number of bistable circuits with the connections coupling these circuits being controllable to render each of a number of the bistable circuits responsive to any one of a plurality of the other bistable circuits in the series.

The overall control of the circuit of Fig. 3 is provided by current signals applied at one or the other of a pair of lands 130 and 132. Land 130 is connected to a conductor 134 which includes the control conductor for a gate connected in path 102, and land 132 is connected to path 136 which includes the control conductor for a gate conductor which is connected in path 100. Conductors 134 and 136 are connected to shield 94 at junctions 138 and 140, respectively. Shield 94 is also provided with a pair of extending segments 94*b* and 94*c*, which are connected to land 142. Thus, when a current signal is applied in either one of the lands 130 or 132, it flows through the associated one of the conductors 134 or 136 to the junction 138 or 140. The current is directed at this junction to the shield and flows in a path immediately beneath the one of the conductors which is carrying the current to the appropriate one of the segments 94*a* or 94*b*, and, thence, to land 142, which is connected either directly or through further superconductor circuitry to ground.

Each of the bistable circuits is also provided with an output circuit. The output circuit for bistable circuit 98 is formed of a pair of conductors 144 and 146. Conductor 144 includes a gate section controlled by a control element connected in path 102 and conductor 146 includes a gate section controlled by a control element connected in path 100. Thus, one or the other of the paths 144 and 146 is superconductive and the other resistive depending upon which of the paths of bistable circuit 98 is carrying the current from source 90. The sense current for the circuit formed by conductors 144 and 146 is provided by a current source 149, here represented by a battery and resistor. The current from this source is directed to the one of the paths 144 and 146 which is then in a superconductive state and, thence, to the utilization circuit connected in that path. Paths 144 and 146 are connected in parallel across source 149 through lands 154 and 156 and are joined to shield 94 at points 150 and 152 through appropriate openings in the insulating layer 96. Thus, when the current is directed to either one of these conductors, this current is returned in a path in the shield immediately beneath that conductor and, thence, through one or the other of a pair of segments 94*d* or 94*e* to a land 148 which is connected to the other terminal of source 149. A similar output circuit, including a pair of paths 160 and 162, is provided to sense the state of bistable circuit 100. These paths extend from lands 172 and 174 to junctions with shield 94 at 164 and 168, respectively. The sense current for this output circuit is provided by a source 171 and is directed to one or the other of the paths and, thence, back in a return path in the shield to the return current terminal at land 170.

The operation of the circuit and the manner in which the currents are distributed both in the superconductor paths and the shield beneath these paths may be understood by considering the state of the circuit when an input current signal is applied to land 130. This signal is directed through path 134 to junction 138 and then back through the shield to and through segment 94*b* to land 142. The current signal is effective to introduce resistance into path 102 so that the current from source 90 is directed into the other path 100 of bistable circuit 98. With the source current in path 100, the sense current from source 149 is directed through conductor 144 to junction 150 and thence back through the shield to land 148. Further, with the current in path 100 of bistable circuit 98, the source current is directed at junction 104 to path 108 of bistable circuit 110 and, similarly, is directed from junction 112 to path 114 of the next successive bistable circuit. With current in path 108 of bistable circuit 110, the sense current from source 171 is directed through path 160 to junction 164 and thence back in a path in the shield immediately beneath conductor 160 to the terminal at land 170.

As was stated above, each of the bistable circuits connected in series with source 90 controls the successive one of the bistable circuits in this series. Further, with an input pulse applied at land 130, the current is directed, in the third of these bistable circuits, from terminal 112 through path 114. Assuming for the present that the circuit formed by paths 114 and 116 controls the circuit formed by paths 118 and 120, the source current is directed through path 120 of the latter circuit to junction 121. From this junction, the source current flows via conductor 122 to the junction at 124 with shield 94 and, flows back in the shield in a path beneath each of the conductors of the bistable circuits in which the source current is then flowing. Thus, the current returns in the shield in a path beneath conductors 122, 120, 144, 108 and 100 to segment 94*a*, which is connected to the ground terminal at land 126. Thus, there is provided in the shield an image of the current flowing in the conductors forming the bistable circuits. By this connection of the circuits on the shield to the shield, to provide a return path for the current, the advantages attendant the use of a superconductor shield are preserved, that is, the inductances of the various conductors forming the circuit are lowered and the Silsbee current characteristics of the gates increased without inducing a large number of circulating currents in the shield.

Figure 4:
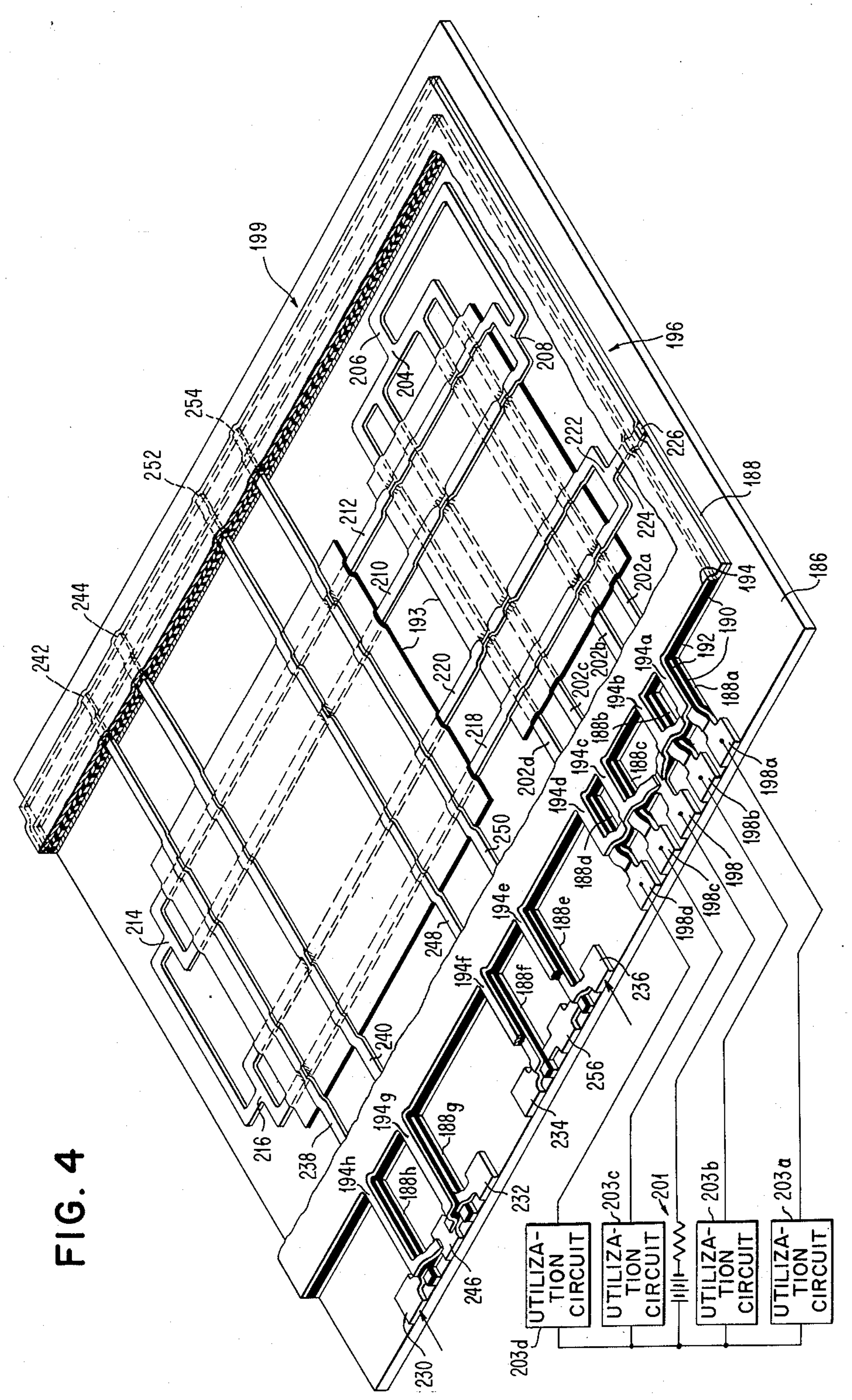
Fig. 4 shows an embodiment of a superconductor circuit which is provided with both upper and lower shields with both shields being connected to the superconductor circuit and one terminal of each of the current supply means for the circuit.

The embodiment of the invention illustrated in Fig. 4 differs from the previous embodiments in that both an upper and lower shield are here provided. Connections are made from the current carrying conductors forming the circuit to both shields so that return current paths are provided in both above and below the current carrying conductors. The provision of the upper shield serves to even further lower the inductance of the conductors forming the circuits, and the double shielding reduces the possibility of coupling of signals between conductors extending in parallel on the substrate along conductors which traverse the parallel extending conductors. This latter type of coupling presents a real difficulty in designing superconductor circuit boards which include a large number of circuit paths arranged very close to each other. In the circuit of Fig. 4, the gate conductor sections are shaded and the control conductor sections are shown narrower than the gate conductor sections. Further, in order to clearly illustrate the circuit as well as the various layers of superconductor and insulating material, portions of the structure have been broken away to reveal the details of the inner construction.

The circuit of Fig. 4 is mounted on a substrate 186 on which there is evaporated a superconductor shield 188. Shield 188 is provided with a plurality of segments **188*a*, 188*b*, etc., each of which extends to one of a number of lands or terminals on the substrate 186. A layer of insulating material 190 is evaporated on top of shield 188, after which the various conductors forming the circuits are evaporated with appropriate layers of insulating material, such as are shown at 193, separating the conductors. After the last of the conductors forming the circuit has been evaporated, an insulating layer 192 is laid down and then finally the top shield, which is designated 194, is evaporated. This top shield is also provided with a number of segments 194*a*, 194*b*, etc., which extend to terminals on substrate 186. The layers of insulating material are laid down so that the upper and lower superconductor shields 188 and 194 contact each other along two edges of the circuit designated 196 and 199**.

The function of the circuit of Fig. 4 is to direct a current from a current source 201 to any one of four parallel output or utilization circuits **203*a*, 203*b*, 203*c* and 203*d* which are respectively connected to terminals 198*a*, 198*b*, 198*c* and 198*d*. A further terminal 198 is connected to the other terminal of source 201 and through the segments 188*a* through 188*d*, and 194*a* through 194*d* to the upper and lower shields 188 and 194. Four parallel superconductor strips 202*a*, 202*b*, 202*c*, and 202*d* are connected to lands 198*a*, 198*b*, 198*c* and 198*d*, respectively. The source current is selectively directed through one of these paths, in a manner later to be explained, to a junction 204, and, thence, via a conductor 206 to a junction 208 from which two parallel paths 210 and 212 extend to a junction 214. The circuit extends from the latter junction to a junction 216 from which two parallel paths 218 and 220 extend to a junction 222. Junction 222 is connected via conductor 224 to a junction 226 with both the upper and lower superconductor shields 188 and 194. At this point, the source current enters both shields and flows back in the shields above and below each of the parallel connected conductors which is then carrying the source current to and through the appropriate one of the segments 188*a*, 188*b*, 188*c* and 188*d*, and appropriate one of the segments 194*a*, 194*b*, 194*c* and 194*d* to land 198**.

The circuit is controlled by signals applied to one or the other of a first pair of input terminals in the form of lands 230 and 232, and to one or the other of a second pair of input terminals in the form of lands 234 and 236. These input circuits are similar and, from the drawing, it can be seen that lands 230 and 232 are connected to conductors 238 and 240, respectively, which extend across the circuit board to junctions 242 and 244, respectively, at which they contact both the upper and lower shields 188 and 194. Thus, when a current is applied to one or the other of input terminals 230 and 232, this current is directed through the associated one of the conductors 238 or 240 to one or the junctions 242 or 244, from which point the current flows back in both the upper and lower shields to output land 246. The circuit from the upper and lower shields to terminal 246 is completed by segments **188*h* and 194*h*, when the current is flowing in conductor 238, and by a similar pair of segments 188*g* and 194*g* when the current is flowing in conductor 240. Similar connections are provided for the conductors connected to terminals 234 and 236 (portions of the upper segments 194*e* and 194*f* are broken away to reveal the details of construction) so that when a current is applied to either of these terminals, it is directed through the one of a pair of paths 248 and 250, which is connected to that terminal and, thence, at either junction 252 or 254, to upper and lower shields 188 and 194. The current is then directed back through these shields to output land 256 in a path which images the current in the particular one of the conductors 248 or 250**.

Each of the conductors 238, 240, 248 and 250 includes a control section for a gate for one of the conductors 210, 212, 218 and 220. Thus, when, for example, input signals are applied, as indicated by the arrows, to terminals 230 and 236, resistance is introduced into the paths 218 and 212. As a result, current flowing between terminals 208 and 214 flows in path 210, and current flowing between the terminals 216 and 222 flows in the path 220. Each of the paths 210, 212, 218 and 220 includes two control sections which are arranged to control two gate sections in the parallel circuit formed by paths **202*a*, 202*b*, 202*c* and 202*d*. With source current from source 201 flowing in conductors 210 and 220, resistance is introduced in paths 202*a*, 202*c*, and 202*d*, and only 202*b* remains completely superconductive. As a result, the current from source 201 is directed through utilization circuit 203*b* to land 198*b* and, thence, through strip 202*b* to terminal 204. From this terminal, the current flows through conductor 206 to terminal 208, from which point the current is directed through path 210 to junction 214. From junction 214 the current flows to junction 216, through conductor 220 to junction 222, and, thence, via conductor 224 to the junction with both the upper and lower shields at 226. The source current is then directed back through both the upper and lower shields so that it flows immediately above and below each one of the conductors in the circuit in which the source current is then flowing. Thus, the current flows immediately above and below conductors 220, 210 and 202*b* to and through the segment 188*b* connected to the lower shield, and the segment 194*b* connected to the upper shield, to the current return terminal at land 198**.

The current can be selectively directed to any one of the four utilization circuits by applying current signals to the proper combination of input terminals 230, 232, 234 and 236. In each case, the operation is similar to that described above with each of the conductors in the circuit being eventually connected to both the upper and lower shields so that a return path is provided in the shields in which a current essentially imaging the current flowing in the conductors is established. Particular note should be made of the fact that the circuit connected to terminal 198, which is connected to the current source, includes a circuit having four parallel conductors connected in series with two other circuits each having two parallel connected conductors.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. In an electrical circuit; a planar substrate; a shield of superconductor material on said substrate; a superconductor circuit including a plurality of parallel connected conductors on said shield and extending from a first point to a second point on said shield; said superconductor circuit being connected to said shield at said second point; the remainder of said superconductor circuit being insulated from said shield; and current supply means for said circuit including first and second terminals; said first terminal being electrically connected to said circuit at said first point; said second terminal being electrically connected to said shield at said first point; whereby, current from said source flows from said first terminal in one direction in said superconductor circuit and returns in an opposite direction to said second terminal in said shield in a path which is the image of the current path in said superconductor circuit.

2. In an electrical circuit; a shield of superconductor material; a superconductor circuit including a plurality of parallel connected collectors adjacent said shield; one end of said superconductor circuit being electrically connected to said shield; the remainder of said superconductor circuit being insulated from said shield; and first and second terminals for said superconductor circuit; said first terminal being connected to said shield; said second terminal being connected to the other end of said superconductor circuit.

3. The electrical circuit of claim 2 wherein said first terminal is connected to said shield at a point adjacent said other end of said superconductor circuit.

4. The circuit of claim 3 wherein said superconductor circuit includes a plurality of groups of parallel connected superconductor paths connected in series between the ends of said superconductor circuit on said shield.

5. In an electrical circuit; a shield of superconductor material; a plurality of superconductor strips forming superconductor circuits on said shield; each of said circuits being connected to said shield; and current supply means for said circuits each having a first terminal connected to the circuit to which it is to supply current and a second terminal connected to said shield at a point adjacent the point at which the first said terminal thereof is connected to said circuit.

6. In an electrical circuit; first and second superconductor shields; a superconductor circuit including a plurality of parallel connected conductors arranged between said shields and connected to both of said shields; and current supply means for said circuit having one of its terminals connected to said superconductor circuit and the other of its terminals connected to both of said shields.

7. In a superconductor circuit; first and second superconductor shields; a superconductor circuit including a plurality of parallel connected conductors arranged between said shields; first and second terminals for said superconductor circuit; said superconductor conductors being electrically connected between said first terminal and said first and second shields; said second terminal being connected to both said shields at a point adjacent said superconductor conductors; whereby current paths are provided from said first terminal through said superconductor conductors to and through said shields to said second terminal.

8. In an electrical circuit; a superconductor shield; a plurality of superconductor strips forming a superconductor circuit mounted on said shield; said circuit being electrically connected to said shield; current supply means connected to said superconductor circuits; and superconductor means connecting said shield to ground.

9. In an electrical circuit; first and second superconductor shields; a plurality of superconductor strips forming superconductor circuits arranged between said shields and electrically connected to said shields; current supply means for said circuits having first and second terminals; said circuit being connected to one of said terminals; said shields being connected together and being connected to the other of said terminals.

10. A superconductor device of the type including a superconductor gate conductor and a control conductor for controlling the state, superconductive or normal, of said gate conductor; said control and gate conductors being arranged on a superconductive shield with said control conductor traversing said gate conductor at right angles thereto; said gate conductor and control conductor each being connected to said shield; and current terminals for said gate conductor, one connected to said gate conductor and the other connected to said shield.

11. A superconductor device of the type including a superconductor gate conductor and a control conductor for controlling the state, superconductive or normal, of said gate conductor; said conductors being arranged on a superconductor shield with each being connected to said shield; and current supply means for said conductors connected to said conductors and to said shield, whereby each of said conductors is provided with a distinct current return path in said shield.

12. In a superconductor circuit; first and second superconductor conductors arranged on a superconductor shield; one end of each of said conductors being connected to said shield and the other end of each of said conductors being connected to current supply means; and current return means for each of said conductors connected to said shield at a point adjacent the other end of that conductor; whereby, when current from said supply means is directed through either one of said conductors, said current flows through that conductor in one direction, and returns in the opposite direction in said shield in a path immediately beneath said conductor.

13. In a superconductor circuit of the type including a plurality of superconductor paths connected in parallel across a current source and having means for selectively introducing resistance into said paths to direct the current from said source into a particular one of said paths; a plurality of superconductor conductors arranged on a superconductor shield and each being connected to said shield; and first and second terminals for each of said parallel connected current paths of said circuit; the first terminal for each path being connected to the one of said conductors which forms at least a part of that path and the second terminal for that path being connected to said shield at a point adjacent the point at which the first terminal is connected to said conductor; whereby, when current from said source is directed through any one of said paths, the current flows in one direction in one of said conductors on said shield which forms part of that path and in an opposite direction immediately beneath that conductor in said shield.

14. In a superconductor circuit; a planar substrate; a shield of superconductor material; first and second superconductor strips on said shield; first, second, third and fourth terminals on said substrate; said first terminal being connected to one end of said first superconductor strip; said second terminal being connected to said shield; said third terminal being connected to one end of said second superconductor strip; said fourth terminal being connected to said shield; each of said strips having its other end connected to said shield and the remaining portions thereof insulated from said shield.

15. In a superconductor circuit; a first plurality of strips of superconductor material; a shield of superconductor material arranged adjacent said superconductor strips; a first plurality of terminals each connected to one end of a corresponding one of said superconductor strips; the other end of each of said strips being connected to said shield; a further terminal; and means connecting said further terminal to said shield at points adjacent each one of said superconductor strips.

16. The circuit of claim 15 wherein each of said first plurality of strips has said other end thereof connected individually to said shield.

17. The circuit of claim 15 wherein each of said strips in said first plurality has said other end thereof connected to said shield by a common superconductor circuit including a second plurality of superconductor strips; there being fewer strips in said second plurality than in said first plurality.

18. The circuit of claim 15 wherein each of said strips in said first plurality has said other end thereof connected to a common superconductor strip which is connected to said shield.

19. In a superconductor circuit; first and second strips of superconductor material; a shield of superconductor material arranged adjacent said superconductor strips; first, second and third terminals; said first superconductor strip being connected between said first terminal and said shield; said second superconductor strip being connected between said second terminal and said shield; and said third terminal being connected to said shield at points adjacent each of said superconductor strips.

20. In a superconductor circuit; a plurality of parallel connected conductors; a superconductor shield arranged adjacent each said conductor for reducing the inductance of said conductor and increasing the Silsbee current for said conductor; each said superconductor conductor and said shield being electrically connected in a circuit with a current source; whereby a current from said source in each said superconductor conductor flows in one direction in said conductor and in an opposite direction in said shield in a path imaging said conductor.

References Cited in the file of this patent

UNITED STATES PATENTS

| | | |
|---|---|---|
| 1,422,130 | Reynolds | July 11, 1922 |
| 2,521,894 | Brown | Sept. 12, 1950 |
| 2,533,908 | Andrews | Dec. 12, 1950 |
| 2,725,474 | Ericsson et al. | Nov. 29, 1955 |